United States Patent
Nadimpalli et al.

(10) Patent No.: US 9,647,610 B2
(45) Date of Patent: May 9, 2017

(54) RF AMPLIFICATION DEVICE WITH POWER PROTECTION DURING HIGH SUPPLY VOLTAGE CONDITIONS

(71) Applicant: RF Micro Devices, Inc., Greensboro, NC (US)

(72) Inventors: Praveen V. Nadimpalli, Greensboro, NC (US); David Ngo, Phoenix, AZ (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/140,605

(22) Filed: Apr. 28, 2016

(65) Prior Publication Data

US 2016/0241200 A1 Aug. 18, 2016

Related U.S. Application Data

(63) Continuation-in-part of application No. 14/478,822, filed on Sep. 5, 2014.
(Continued)

(51) Int. Cl.
| | |
|---|---|
| H03F 1/02 | (2006.01) |
| H03F 3/21 | (2006.01) |
| H03F 3/19 | (2006.01) |
| H03K 3/354 | (2006.01) |
| G05F 1/56 | (2006.01) |
| H03F 1/52 | (2006.01) |

(52) U.S. Cl.
CPC .......... *H03F 1/0222* (2013.01); *G05F 1/561* (2013.01); *H03F 1/523* (2013.01); *H03F 3/19* (2013.01); *H03F 3/21* (2013.01); *H03F 2200/258* (2013.01); *H03F 2200/408* (2013.01); *H03F 2200/451* (2013.01); *H03F 2203/21193* (2013.01)

(58) Field of Classification Search
USPC .......................... 330/296–297, 127, 134, 279
See application file for complete search history.

(56) References Cited

U.S. PATENT DOCUMENTS

| | | | |
|---|---|---|---|
| 6,825,726 B2* | 11/2004 | French | H03F 1/0227 323/222 |
| 7,545,217 B1 | 6/2009 | Reyes | |

(Continued)

OTHER PUBLICATIONS

Non-Final Office Action for U.S. Appl. No. 14/478,822, mailed Oct. 6, 2015, 12 pages.
(Continued)

*Primary Examiner* — Hieu Nguyen
(74) *Attorney, Agent, or Firm* — Withrow & Terranova, P.L.L.C.

(57) ABSTRACT

A radio frequency (RF) amplification device comprises an RF amplification circuit, and a dynamic level shifter (DLS) circuit coupled between a supply voltage and the RF amplification circuit. The DLS circuit is configured to provide a first shifted voltage to the RF amplification circuit via a first diode when the supply voltage is above a first threshold voltage level. The DLS circuit is further configured to provide a second shifted voltage to the RF amplification circuit via a first shunt transistor when the supply voltage is below the first threshold voltage level, wherein the supply voltage less the second shifted voltage is less than the supply voltage less the first shifted voltage.

18 Claims, 12 Drawing Sheets

Related U.S. Application Data

(60) Provisional application No. 61/874,713, filed on Sep. 6, 2013, provisional application No. 62/215,800, filed on Sep. 9, 2015.

(56) References Cited

U.S. PATENT DOCUMENTS

| | | |
|---|---|---|
| 7,605,651 B2 | 10/2009 | Ripley et al. |
| 7,944,306 B2 | 5/2011 | Prikhodko et al. |
| 8,022,770 B1 | 9/2011 | Wang |
| 8,432,228 B1 | 4/2013 | Dolin |
| 9,172,331 B2 * | 10/2015 | Nagasaku ............... H03F 3/217 |
| 2006/0238244 A1 * | 10/2006 | Grundlingh ........... H03F 1/0211 |
| | | 330/136 |
| 2013/0272547 A1 * | 10/2013 | Waller, Jr. ................ H04R 3/00 |
| | | 381/120 |
| 2015/0070098 A1 | 3/2015 | Ngo et al. |

OTHER PUBLICATIONS

Final Office Action for U.S. Appl. No. 14/478,822, mailed Feb. 22, 2016, 13 pages.
Advisory Action for U.S. Appl. No. 14/478,822, mailed May 10, 2016, 3 pages.
Non-Final Office Action for U.S. Appl. No. 14/478,822, mailed Sep. 8, 2016, 13 pages.
Non-Final Office Action for U.S. Appl. No. 14/478,822, mailed Feb. 8, 2017, 12 pages.

\* cited by examiner

RF AMPLIFICATION DEVICE WITH POWER PROTECTION DURING HIGH SUPPLY VOLTAGE CONDITIONS

RELATED APPLICATIONS

The present application is a continuation-in-part of co-pending U.S. patent application Ser. No. 14/478,822, entitled "RF AMPLIFICATION DEVICE WITH POWER PROTECTION DURING HIGH SUPPLY VOLTAGE CONDITIONS," filed Sep. 5, 2014, which claims priority to U.S. Provisional Patent Application No. 61/874,713, entitled "POWER LIMITER FOR INPUT POWER CONTROL POWER AMPLIFIERS," filed Sep. 6, 2013, which are incorporated herein by reference in their entireties.

The present application also claims priority to U.S. Provisional Patent Application No. 62/215,800, entitled "DYNAMIC LEVEL SHIFTER FOR RUGGEDNESS IMPROVEMENT," filed Sep. 9, 2015, the disclosure of which is hereby incorporated herein by reference in its entirety.

FIELD OF THE DISCLOSURE

The field of the disclosure is amplifier circuits, including voltage regulation circuits for limiting the output power of one or more amplifiers in a series of amplifiers.

BACKGROUND

Conventional mobile communication circuits often include two stage and/or three stage amplifier circuits comprising a series of amplifiers. These may be constant gain or variable gain amplifiers. Constant gain amplifiers can be damaged under high supply voltage (e.g., high battery voltage) conditions that may occur as a result of supply current surges. For example, some cellular phones use batteries including three 1.5 volt cells in series, yielding a maximum theoretical voltage of 4.5 volts. After the cell phone is turned on, battery voltage (Vbat) may be 4.25 volts for a few seconds (for a short time at start up). Similarly, charging the battery during use may cause relatively high battery voltages. However, most of the time, the battery voltage is about 3.5 volts during operation. Thus, many circuits, such as constant gain amplifiers, are designed to operate efficiently at a nominal battery voltage (Vbatnom) of 3.5 volts. In these designs, a battery voltage in excess of Vbatnom may cause a maximum output power that exceeds physical limits (design limits) of a constant gain amplifier. If the constant gain amplifier is designed (tuned) for operating with a nominal battery voltage of 3.5 volts, then the constant gain amplifier may be damaged if a battery voltage of 4.25 volts is received. Further, the constant gain amplifiers can also be damaged by high input RF drive levels. The RF-based damage can be a function of both battery voltage and input RF drive levels.

Thus, amplifier topologies and techniques are needed to protect the constant gain amplifier from supply voltage conditions exceeding design limits.

SUMMARY

The field of the disclosure is amplifier circuits, including voltage regulation circuits for limiting the output power of one or more amplifiers in a series of amplifiers. In one embodiment, a radio frequency (RF) amplification device includes an RF amplification circuit, and a dynamic level shifter (DLS) circuit coupled between a supply voltage and the RF amplification circuit. The DLS circuit is configured to provide a first shifted voltage to the RF amplification circuit via a first diode when the supply voltage is above a first threshold voltage level. The DLS circuit is further configured to provide a second shifted voltage to the RF amplification circuit via a first shunt transistor when the supply voltage is below the first threshold voltage level. Further, the supply voltage less the second shifted voltage is less than the supply voltage less the first shifted voltage.

In one embodiment, the first shunt transistor is configured to short-circuit the first diode when the supply voltage is below the first threshold voltage level. A cathode of the first diode may be coupled to the RF amplification circuit and a source of the first shunt transistor, while an anode of the first diode may be coupled to a drain of the first shunt transistor. A gate of the first shunt transistor may be coupled to a voltage reference. The first diode may be a PIN diode, and the first shunt transistor may be one of a depletion mode n-type field effect transistor (FET) and a depletion mode n-type pseudomorphic high electron mobility transistor (pHEMT).

In one embodiment, the DLS circuit is further configured to (1) provide the first shifted voltage via the first diode and a second diode that is coupled in series with the first diode; (2) provide the second shifted voltage via the first shunt transistor and the second diode when the supply voltage is between the first threshold voltage level and a second threshold voltage level; and (3) provide a third shifted voltage to the RF amplification circuit via a second shunt transistor when the supply voltage is below the second threshold voltage level. The supply voltage less the third shifted voltage is less than the supply voltage less the second shifted voltage.

The first shunt transistor may be configured to short-circuit the first diode when the supply voltage is below the first threshold voltage level, while the second shunt transistor may be configured to short-circuit the first diode and the second diode when the supply voltage is below the second threshold voltage level. The first shifted voltage may be the supply voltage less a forward voltage drop of the first diode and a forward voltage drop of the second diode. Further, the second shifted voltage may be the supply voltage less the forward voltage drop of the second diode; and the third shifted voltage may be approximately equal to the supply voltage.

The cathode of the first diode may be coupled to the RF amplification circuit, the source of the first shunt transistor, and a source of the second shunt transistor. The anode of the first diode may be coupled to a cathode of the second diode and to the drain of the first shunt transistor, while an anode of the second diode may be coupled to the supply voltage and a drain of the second shunt transistor. The gate of the first shunt transistor may be coupled with a voltage reference, while a gate of the second shunt transistor may be coupled with a ground. The first diode may be a PIN diode and the second diode may be a Schottky barrier diode, while the first shunt transistor may be one of a depletion mode n-type field effect transistor (FET) and a depletion mode n-type pseudomorphic high electron mobility transistor (pHEMT). Further, the second shunt transistor may also be one of a depletion mode n-type FET and a depletion mode n-type pHEMT.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
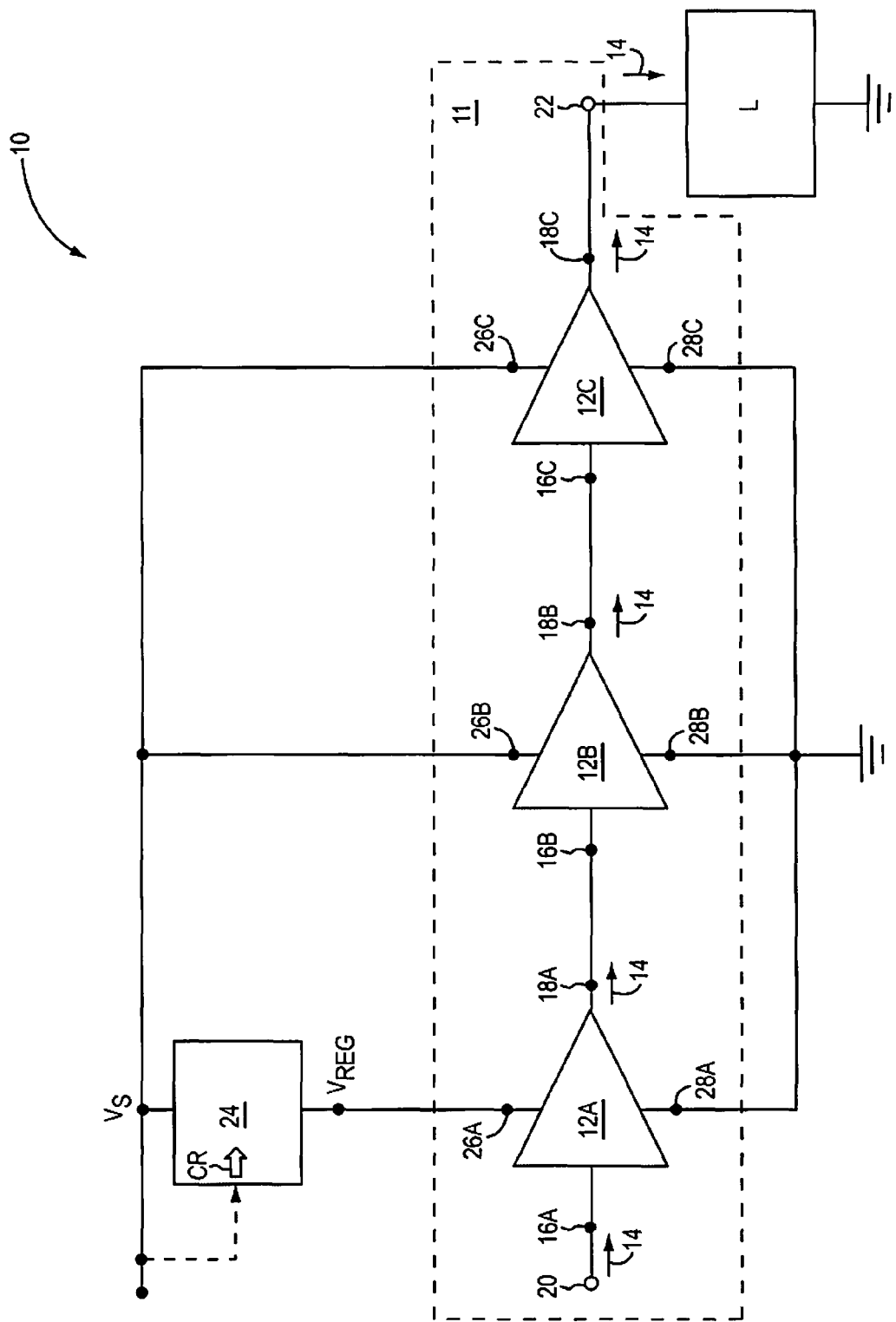
FIG. 1 illustrates one embodiment of an RF amplification device that includes a plurality of RF amplifier stages coupled in cascade and a voltage regulation circuit that is configured to provide a regulated voltage in accordance with this disclosure to an initial RF amplifier stage.

FIG. 1 illustrates one embodiment of an RF amplification device 10. The RF amplification device 10 includes an RF amplification circuit 11 that includes a plurality of RF amplifier stages (referred to generically as element 12, and specifically as elements 12A-12C) coupled in cascade. Accordingly, each of the plurality of RF amplifier stages 12 is operable to provide amplification to an RF signal 14. In other words, by being coupled in cascade, the RF amplifier stages 12 provide amplification to the RF signal 14 in sequence.

The RF amplification device 10 shown in FIG. 1 has an initial RF amplifier stage 12A, an intermediate RF amplifier stage 12B, and a final RF amplifier stage 12C. However, other embodiments of the RF amplification device 10 may include any number of RF amplifier stages 12 greater than or equal to two (2). The initial RF amplifier stage 12A is the RF amplifier stage 12 at a beginning of the sequence. The final RF amplifier stage 12C is the RF amplifier stage 12 at an end of the sequence. Since at least two RF amplifier stages 12 are needed to provide cascaded RF amplifier stages 12, the RF amplification device 10 includes at least the initial RF amplifier stage 12A and the final RF amplifier stage 12C. However, the number of RF amplifier stages 12 may be any integer greater than or equal to two (2). As such, there may be any number of intermediate RF amplifier stages, like the intermediate RF amplifier stage 12B, coupled in cascade between the initial RF amplifier stage 12A and the final RF amplifier stage 12C. In the embodiment illustrated in FIG. 1, the RF amplification device 10 has three RF amplifier stages 12. Thus, one intermediate RF amplifier stage 12B is coupled in cascade between the initial RF amplifier stage 12A and the final RF amplifier stage 12C.

Since the RF amplifier stages 12 are coupled in cascade, the RF amplifier stages 12 provide amplification to the RF signal 14 in a sequence. Accordingly, the initial RF amplifier stage 12A initially provides amplification to the RF signal 14 in accordance with an amplifier gain $G_{initial}$. Once the RF signal 14 is amplified by the initial RF amplifier stage 12A in accordance with the amplifier gain $G_{initial}$, the intermediate RF amplifier stage 12B amplifies the RF signal 14 in accordance with an amplifier gain $G_{intermediate}$. Once the RF signal 14 is amplified by the intermediate RF amplifier stage 12B in accordance with the amplifier gain $G_{intermediate}$, the final RF amplifier stage 12C amplifies the RF signal 14 in accordance to an amplifier gain $G_{final}$. As such, an aggregated amplifier gain of the plurality of RF amplifier stages 12 as a whole may be described as $G_{initial}*G_{intermediate}*G_{final}$. In other words, an amplifier gain of the RF amplification circuit 11 is the aggregated amplifier gain of the plurality of RF amplifier stages 12.

In the particular embodiment shown in FIG. 1, the initial RF amplifier stage 12A has an input terminus 16A and an output terminus 18A. The intermediate RF amplifier stage 12B has an input terminus 16B and an output terminus 18B. The final RF amplifier stage 12C has an input terminus 16C and an output terminus 18C. With regard to the term "terminus," terminus refers to any component or set of components configured to input and/or output RF signals. For example, in FIG. 1, the RF amplification device 10 is illustrated as receiving the RF signal 14 as a single-ended signal. Thus, the input termini 16A, 16B, 16C, and the output termini 18A, 18B, 18C may each be a single-ended terminal or node. However, in other embodiments, the RF signal 14 may be received as a differential signal. In this embodiment, the input termini 16A, 16B, 16C, and the output termini 18A, 18B, 18C may each be a pair of terminals or nodes configured to receive and/or transmit differential signals.

The RF amplification device 10 shown in FIG. 1 includes an input terminus 20 to receive the RF signal 14 from upstream RF circuitry. The input terminus 16A of the initial RF amplifier stage 12A is coupled to receive the RF signal 14 from the input terminus 20. The RF amplification device 10 shown in FIG. 1 also has an output terminus 22. The output terminus 18C of the final RF amplifier stage 12C is coupled to the output terminus 22 so as to provide the RF signal 14 after amplification to downstream RF circuitry. As a result, the RF amplifier stages 12 are coupled in cascade between the input terminus 20 and the output terminus 22.

To amplify the RF signal 14 in accordance with the amplifier gain $G_{initial}$, the initial RF amplifier stage 12A receives the RF signal 14 at the input terminus 16A. Once the initial RF amplifier stage 12A has provided amplification to the RF signal 14 in accordance with the amplifier gain $G_{initial}$, the initial RF amplifier stage 12A transmits the RF signal 14 from the output terminus 18A. The RF signal 14 is then received by the input terminus 16B of the intermediate RF amplifier stage 12B. Once the intermediate RF amplifier stage 12B amplifies the RF signal 14 in accordance with the amplifier gain $G_{intermediate}$, the intermediate RF amplifier stage 12B transmits the RF signal 14 from the output terminus 18B. The final RF amplifier stage 12C then receives the RF signal 14 at the input terminus 16C and amplifies the RF signal 14 in accordance with the amplifier gain $G_{final}$. Once the final RF amplifier stage 12C has provided amplification to the RF signal 14 in accordance with the amplifier gain $G_{final}$, the final RF amplifier stage 12C transmits the RF signal 14 from the output terminus 18C. The RF signal 14 may then be transmitted by the output terminus 22 to downstream RF circuitry, such as the load L.

To provide power for amplification, each of the RF amplifier stages 12 receives a supply voltage $V_{supply}$. The power provided by the supply voltage $V_{supply}$ is then transferred to the RF signal 14 by each of the RF amplifier stages 12 in accordance with its respective amplifier gain, $G_{initial}$, $G_{intermediate}$, and $G_{final}$. However, note that as the RF signal 14 progresses through the sequence, each of the RF amplifier stages 12 handles an increasing amount of power. Therefore, the initial RF amplifier stage 12A handles the least amount of power, since it receives the RF signal 14 prior to amplification and transmits the RF signal 14 amplified only in accordance with the amplifier gain $G_{initial}$. When the intermediate RF amplifier stage 12B receives the RF signal 14, the RF signal 14 has already been amplified by the amplifier gain $G_{initial}$. The intermediate RF amplifier stage 12B further amplifies the RF signal 14 in accordance with the amplifier gain $G_{intermediate}$. Thus, the intermediate RF amplifier stage 12B transmits the RF signal 14 amplified in accordance with the amplifier gain $G_{initial}*G_{intermediate}$. As a result, the intermediate RF amplifier stage 12B handles an intermediate amount of power. The final RF amplifier stage 12C receives the RF signal 14 amplified in accordance with the aggregate amplifier gain $G_{initial}*G_{intermediate}$. As such, when the final RF amplifier stage 12C further amplifies the RF signal 14 by the amplifier gain $G_{final}$, the final RF amplifier stage 12C transmits the RF signal 14 amplified in accordance with the aggregate amplifier gain of $G_{initial}*G_{intermediate}*G_{final}$. As such, the final RF amplifier stage 12C handles the most power.

Each RF amplifier stage 12 is configured to provide amplification so that it may handle the appropriate power levels. For example, the RF amplifier stages 12 may include a transistor, a network of transistors, op-amps, and/or any other type of suitable RF amplification component. Often, the initial RF amplifier stage 12A and the intermediate RF amplifier stage 12B are classified as "driver" RF amplifier stages 12. In some embodiments, each of the driver RF amplifier stages 12 may have a single transistor or a pair of transistors to provide amplification. However, since the final RF amplifier stage 12C handles the most power, some embodiments of the final RF amplifier stage 12C may include arrays of transistors or stacks of transistors in order to handle the power levels seen by the final RF amplifier stage 12C.

Referring again to FIG. 1, a voltage regulation circuit 24 is coupled to provide a regulated voltage $V_{REG}$ to the initial RF amplifier stage 12A (i.e., one of the driver RF amplifier stages). The voltage regulation circuit 24 is configured to generate the regulated voltage $V_{REG}$ from a supply voltage $V_S$. The supply voltage $V_S$ may be a power source voltage, such as a battery voltage, or a bias voltage from a supply control network. Since the RF amplifier stages 12 of the RF amplification circuit 11 are configured to provide amplification at a particular supply level, under certain high RF input power and supply voltage conditions, a maximum output power of the RF amplification circuit 11 can be beyond the physical limits of the final RF amplifier stage 12C. As a result, this excess in output power will degrade the robustness of the RF amplification circuit 11. The voltage regulation circuit 24 operates to improve the robustness of the RF amplification circuit 12 by limiting the maximum output power and thus preventing damage and degradation at the final RF amplifier stage 12C.

More specifically, the maximum output power of the RF amplification circuit 11 is set based on the regulated voltage $V_{REG}$. While the supply voltage Vs is below a threshold voltage level, the voltage regulation circuit 24 is configured to drive the regulated voltage $V_{REG}$ to approximately a first voltage level. The threshold voltage level of the supply voltage $V_S$ is determined to be a level of the supply voltage $V_S$ where it is safe to operate the RF amplification circuit 11 and the final RF amplifier stage 12C. While the regulated voltage $V_{REG}$ is maintained as approximately constant at a first voltage level, the maximum output power of the RF amplification circuit 11 can vary as different amount of current may be provided to the RF amplification circuit 11. However, the regulated voltage $V_{REG}$ at the first voltage level may cause output power levels at the initial RF amplifier stage 12A to result in excessive power levels at the final RF amplifier stage 12C. Accordingly, while the supply voltage $V_S$ is above the threshold voltage level, the voltage regulation circuit 24 is configured to drive the regulated voltage $V_{REG}$ below the first voltage level such that the maximum output power of the RF amplification circuit 11 is provided approximately at a first power level. The first power level is a power level where the maximum output power of the RF amplification circuit 11 is at safe levels for operation of the final RF amplifier stage 12C. As such, in this case, the voltage regulation circuit 24 varies the regulated voltage $V_{REG}$ below the first voltage level and based on the supply voltage $V_S$ in order to maintain the maximum output power of the RF amplification circuit 11 at the first power level.

To generate the regulated voltage $V_{REG}$, the voltage regulation circuit 24 is configured to generate a control reference CR endogenously from the supply voltage $V_S$. The control reference CR indicates a target regulated voltage. Accordingly, rather than receiving a control reference (not shown) generated externally from the voltage regulation circuit 24 in order to set the regulated voltage $V_{REG}$ generated by the voltage regulation circuit 24, the voltage regulation circuit 24 is configured to generate the control reference CR from the supply voltage $V_S$ so that the control reference CR is endogenous to the voltage regulation circuit 24 itself. Thus, as the control reference CR changes, so does the regulated voltage $V_{REG}$ generated by the voltage regulation circuit 24.

As such, to provide the behavior described above with respect to the threshold voltage level and the supply voltage $V_S$, the voltage regulation circuit 24 is configured to set the control reference CR such that the control reference CR indicates that the target regulated voltage is set approximately at the first voltage level in response to the supply voltage $V_S$ being below the threshold voltage level. Furthermore, the voltage regulation circuit 24 is configured to set the control reference CR such that the control reference CR indicates that the target regulated voltage is below the first voltage level so that the voltage regulation circuit 24 maintains the maximum output power of the RF amplification circuit 11 approximately at the first power level in response to the supply voltage $V_S$ being above the threshold voltage level. The voltage regulation circuit 24 is configured to drive the regulated voltage $V_{REG}$ to the target regulated voltage indicated by the control reference CR. Thus, while the supply voltage $V_S$ is below a threshold voltage level, the voltage regulation circuit 24 is configured to drive the regulated voltage $V_{REG}$ to approximately the first voltage level. Also, the voltage regulation circuit 24 is configured to drive the regulated voltage $V_{REG}$ below the first voltage level such that the maximum output power of the RF amplification circuit 11 is provided approximately at the first power level while the supply voltage $V_S$ is above the threshold voltage level.

In this embodiment, each of the RF amplifier stages 12 includes a supply terminus (referred to generically as element "26" and specifically as elements 26A-26C). More specifically, the initial RF amplifier stage 12A includes a supply terminus 26A, the intermediate RF amplifier stage 12B includes a supply terminus 26B, and the final RF amplifier stage 12C includes a supply terminus 26C. At each of the supply termini 26, the RF amplifier stage 12 receives a biasing voltage for amplification of the RF signal 14 by the RF amplifier stage 12. As shown in FIG. 1, the initial RF amplifier stage 12A has the supply terminus 26A coupled to receive the regulated voltage $V_{REG}$. The intermediate RF amplifier stage 12B has the supply terminus 26B coupled to receive the supply voltage $V_S$, and the final RF amplifier stage 12C has the supply terminus 26C coupled to receive the supply voltage $V_S$. Thus, in this case, the voltage regulation circuit 24 only controls the initial RF amplifier stage 12A. In an alternative embodiment, the voltage regulation circuit 24 only provides the regulated voltage $V_{REG}$ at the supply terminus 26B of the intermediate RF amplifier stage 12B, and thus only controls the intermediate RF amplifier stage 12B instead of the initial RF amplifier stage 12A.

Additionally, each of the RF amplifier stages 12 shown in FIG. 1 also includes a grounding terminus (referred to generically as element "28" and specifically as elements 28A-28C). More specifically, the initial RF amplifier stage 12A includes a grounding terminus 28A, the intermediate RF amplifier stage 12B includes a grounding terminus 28B, and the final RF amplifier stage 12C includes a grounding terminus 28C. At each of the grounding termini 28, the RF amplifier stage 12 is connected to ground.

Figure 1A:
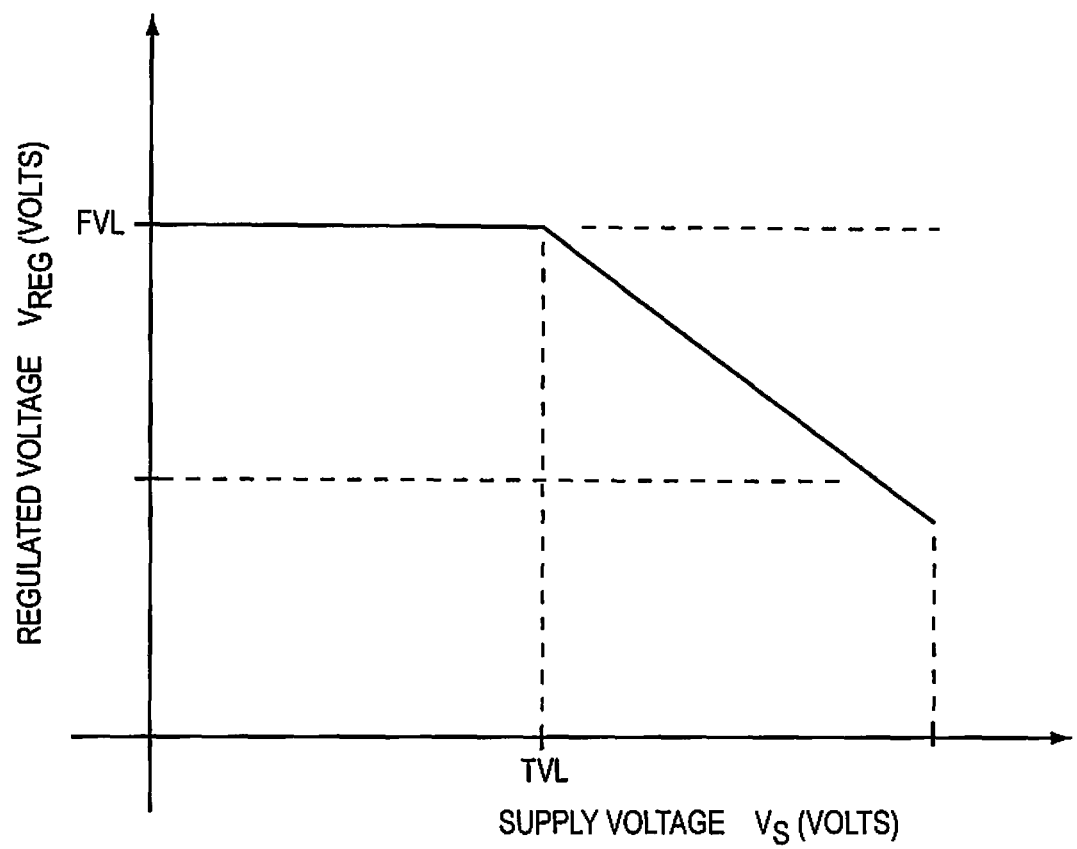
FIG. 1A illustrates one embodiment of a relationship between a supply voltage and the regulated voltage generated by the voltage regulation circuit shown in FIG. 1.

Referring now to FIG. 1 and FIG. 1A, FIG. 1A illustrates one embodiment of a curve implemented by the voltage regulation circuit 24. As shown by FIG. 1A, the curve maps the supply voltage $V_S$ to the regulated voltage $V_{REG}$. As shown in FIG. 1A, while the supply voltage $V_S$ is below the threshold voltage level TVL, the voltage regulation circuit 24 is configured to drive the regulated voltage $V_{REG}$ to approximately the first voltage level FVL. Also, the voltage regulation circuit 24 is configured to drive the regulated voltage $V_{REG}$ below the first voltage level FVL while the supply voltage $V_S$ is above the threshold voltage level TVL.

Accordingly, the voltage regulation circuit 24 is configured so that the target regulated voltage indicated by the control reference CR is set as a function of the supply voltage $V_S$ in response to the supply voltage $V_S$ being above the threshold voltage level TVL. In this example, the function of the supply voltage Vs decreases the target regulated voltage indicated by the control reference CR as the supply voltage $V_S$ increases. The function shown in FIG. 1A is approximately linear and thus results in the regulated voltage $V_{REG}$ being inversely proportional to the supply voltage $V_S$. This function maintains the maximum output power of the RF amplification circuit 11 approximately at the first power level. The target regulated voltage indicated by the control reference CR, and thus the regulated voltage $V_{REG}$ is below the first voltage level FVL while the supply voltage $V_S$ is above the threshold voltage level TVL. While the supply voltage $V_S$ is above the threshold voltage level TVL, the target regulated voltage indicated by the control reference CR indicates the first voltage level, and thus the voltage regulation circuit 24 drives the regulated voltage $V_{REG}$ to the first voltage level FVL.

Figure 2:
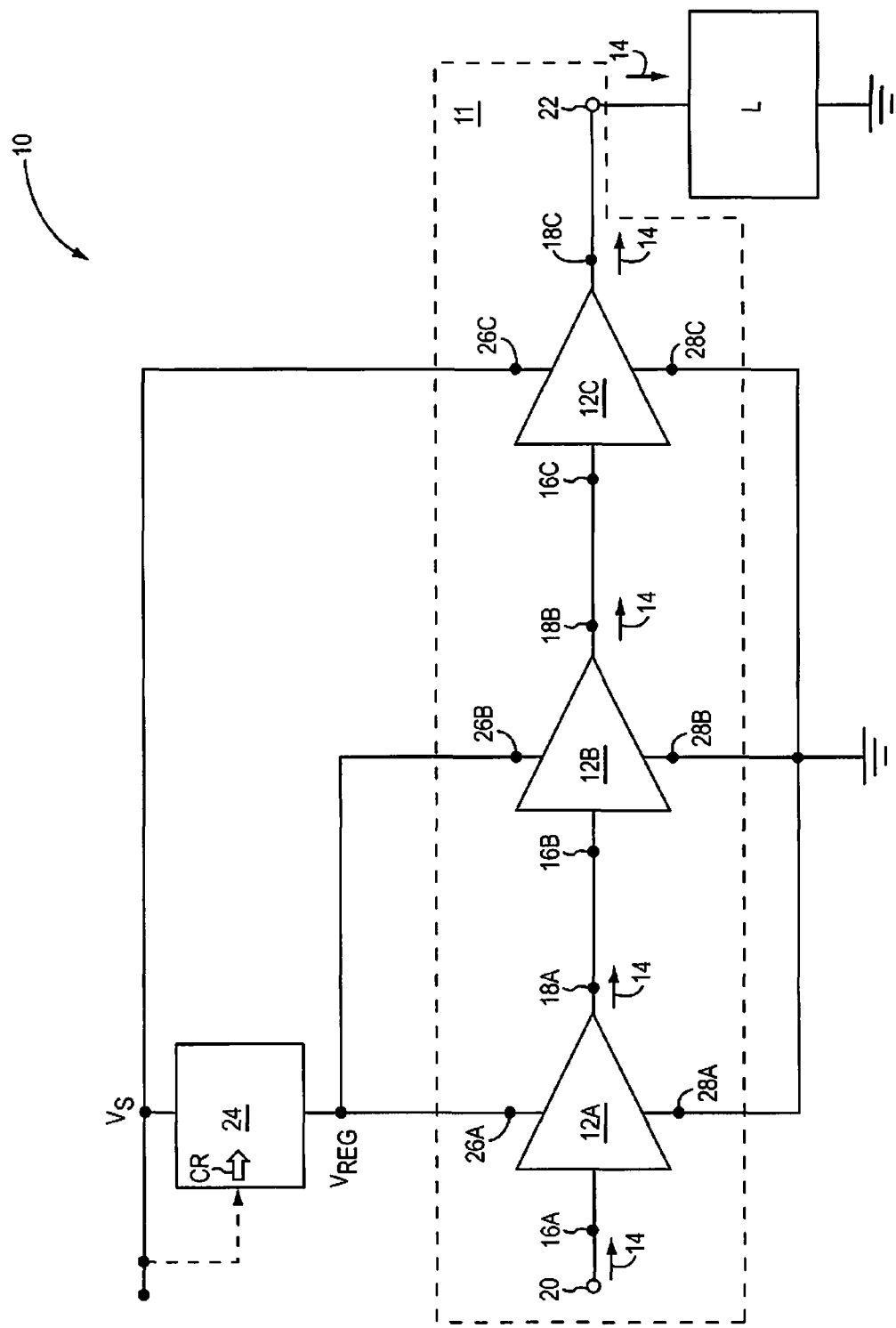
FIG. 2 illustrates another embodiment of an RF amplification device that is the same as the RF amplification device shown in FIG. 1 except that the regulated voltage generated by the voltage regulation circuit is provided to the initial RF amplifier stage and an intermediate RF amplifier stage.

FIG. 2 illustrates another embodiment of the RF amplification device 10. The RF amplification device 10 shown in FIG. 2 is the same as the RF amplification device 10 shown in FIG. 1, except that in this embodiment, the supply terminus 26B is coupled to receive the regulated voltage $V_{REG}$ instead of the supply voltage $V_S$. In other words, the initial RF amplifier stage 12A has the supply terminus 26A coupled to receive the regulated voltage $V_{REG}$, the intermediate RF amplifier stage 12B has the supply terminus 26B coupled to receive the regulated voltage $V_{REG}$, and the final RF amplifier stage 12C has the supply terminus 26C coupled to receive the supply voltage $V_S$. Thus, in this case, the voltage regulation circuit 24 controls the initial RF amplifier stage 12A and the intermediate RF amplifier stage 12B. Thus, the maximum output power of the RF amplification circuit 11 is controlled with both the initial RF amplifier stage 12A and the intermediate RF amplifier stage 12B.

Figure 3:
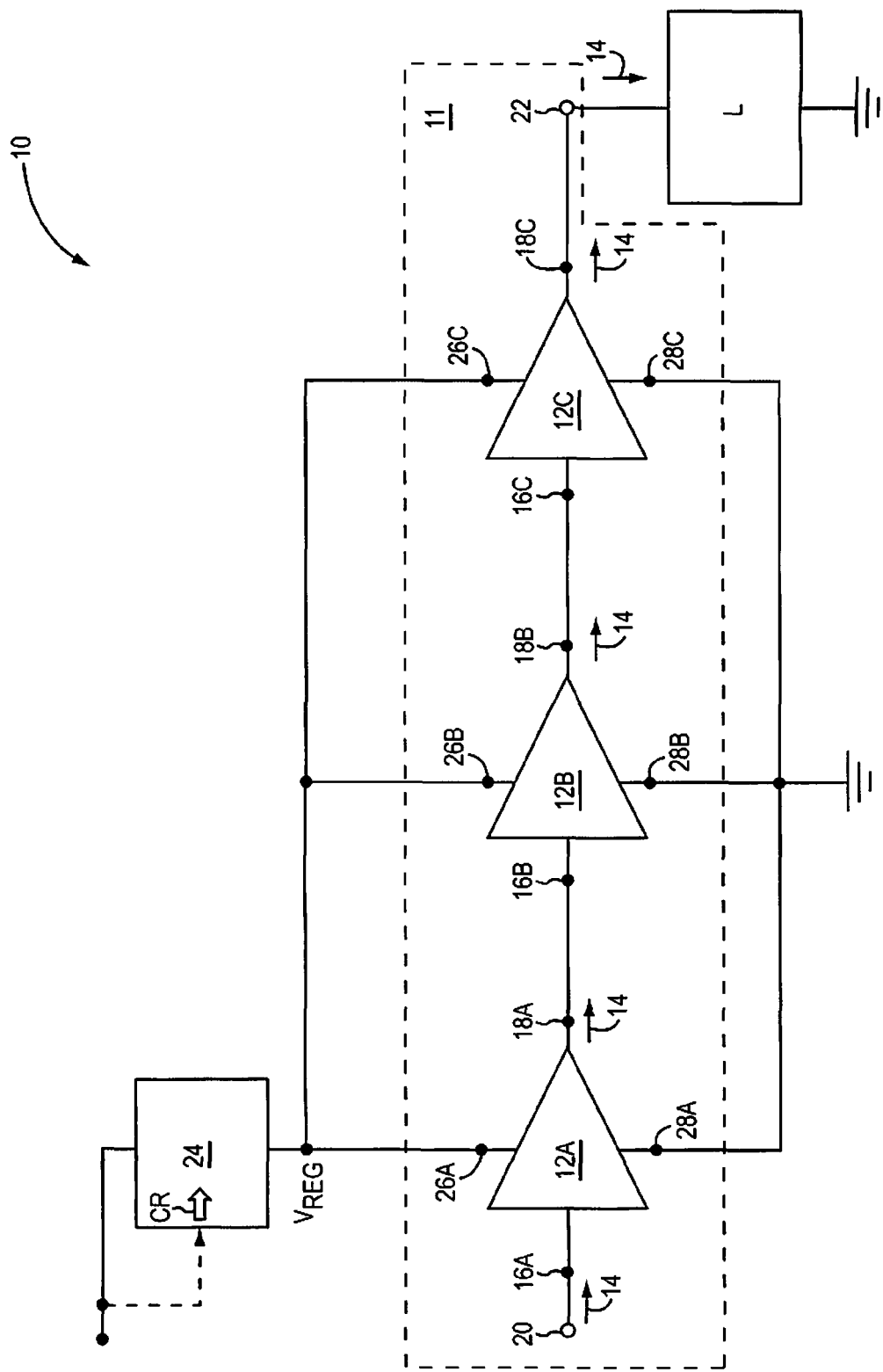
FIG. 3 illustrates still another embodiment of an RF amplification device that is the same as the RF amplification device shown in FIG. 1 except that the regulated voltage generated by the voltage regulation circuit is provided to the initial RF amplifier stage, the intermediate RF amplifier stage, and the final RF amplifier stage.

FIG. 3 illustrates yet another embodiment of the RF amplification device 10. The RF amplification device 10 shown in FIG. 3 is the same as the RF amplification device 10 shown in FIG. 1, except that in this embodiment, the supply terminus 26B and the supply terminus 26C are coupled to receive the regulated voltage $V_{REG}$ instead of the supply voltage $V_S$. In other words, the initial RF amplifier stage 12A has the supply terminus 26A coupled to receive the regulated voltage $V_{REG}$, the intermediate RF amplifier stage 12B has the supply terminus 26B coupled to receive the regulated voltage $V_{REG}$, and the final RF amplifier stage 12C has the supply terminus 26C coupled to receive the regulated voltage $V_{REG}$. Therefore, in this case, the voltage regulation circuit 24 controls the initial RF amplifier stage 12A the intermediate RF amplifier stage 12B, and the final RF amplifier stage 12C. Thus, the maximum output power of the RF amplification circuit 11 is controlled with all of the RF amplifier stages 12. It should be noted that under normal operating conditions, the voltage drop across the voltage regulation circuit 24 in FIG. 3 may more strictly limit the maximum output power of the RF amplification circuit 11 since this voltage drop effectively lowers the regulated voltage $V_{REG}$ used to supply the final RF amplifier stage 12C.

Figure 4:
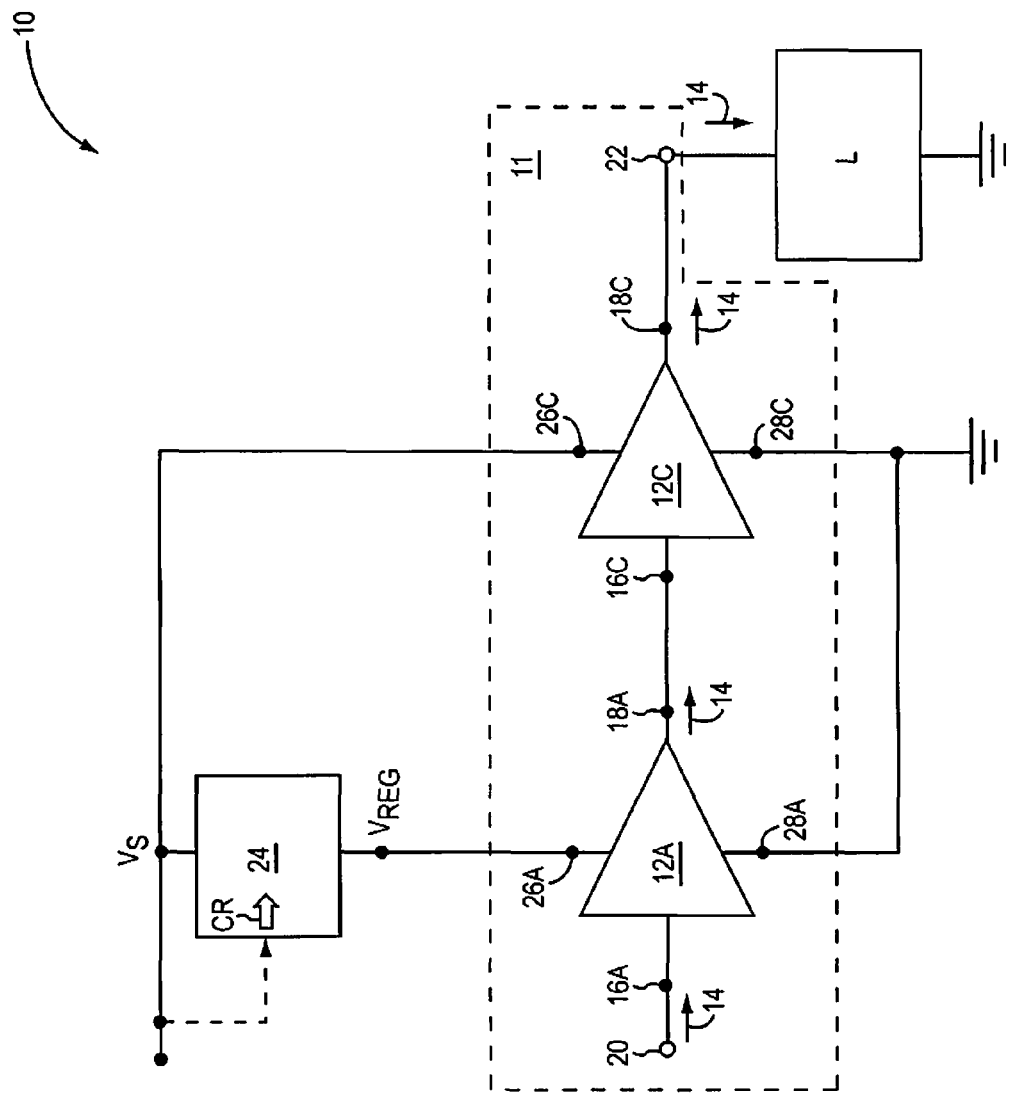
FIG. 4 illustrates still another embodiment of an RF amplification device that is the same as the RF amplification device shown in FIG. 1 except that there is no intermediate RF amplifier stage.

FIG. 4 illustrates yet another embodiment of the RF amplification device 10. The RF amplification device 10 shown in FIG. 3 is the same as the RF amplification device 10 shown in FIG. 1, except that in this embodiment, the intermediate RF amplifier stage 12B (shown in FIG. 1) is not provided in the RF amplification circuit 11 but rather only the initial RF amplifier stage 12A and the final RF amplifier stage 12C. As such, the output terminus 18A is connected to the input terminus 16C. In other words, the initial RF amplifier stage 12A has the supply terminus 26A coupled to receive the regulated voltage $V_{REG}$, the intermediate RF amplifier stage 12B has the supply terminus 26B coupled to receive the regulated voltage $V_{REG}$, and the final RF amplifier stage 12C has the supply terminus 26C coupled to receive the regulated voltage $V_{REG}$. Thus, in this case, the voltage regulation circuit 24 controls the initial RF amplifier stage 12A, the intermediate RF amplifier stage 12B, and the final RF amplifier stage 12C. In this embodiment, the initial RF amplifier stage 12A has the supply terminus 26A coupled to receive the regulated voltage $V_{REG}$, and the final RF amplifier stage 12C has the supply terminus 26C coupled to receive the supply voltage $V_S$. Thus, in this case, the voltage regulation circuit 24 controls only the initial RF amplifier stage 12A. In alternative embodiments, the maximum output power of the RF amplification circuit 11 is controlled with both the initial RF amplifier stage 12A and the final RF amplifier stage 12C.

Figure 5:
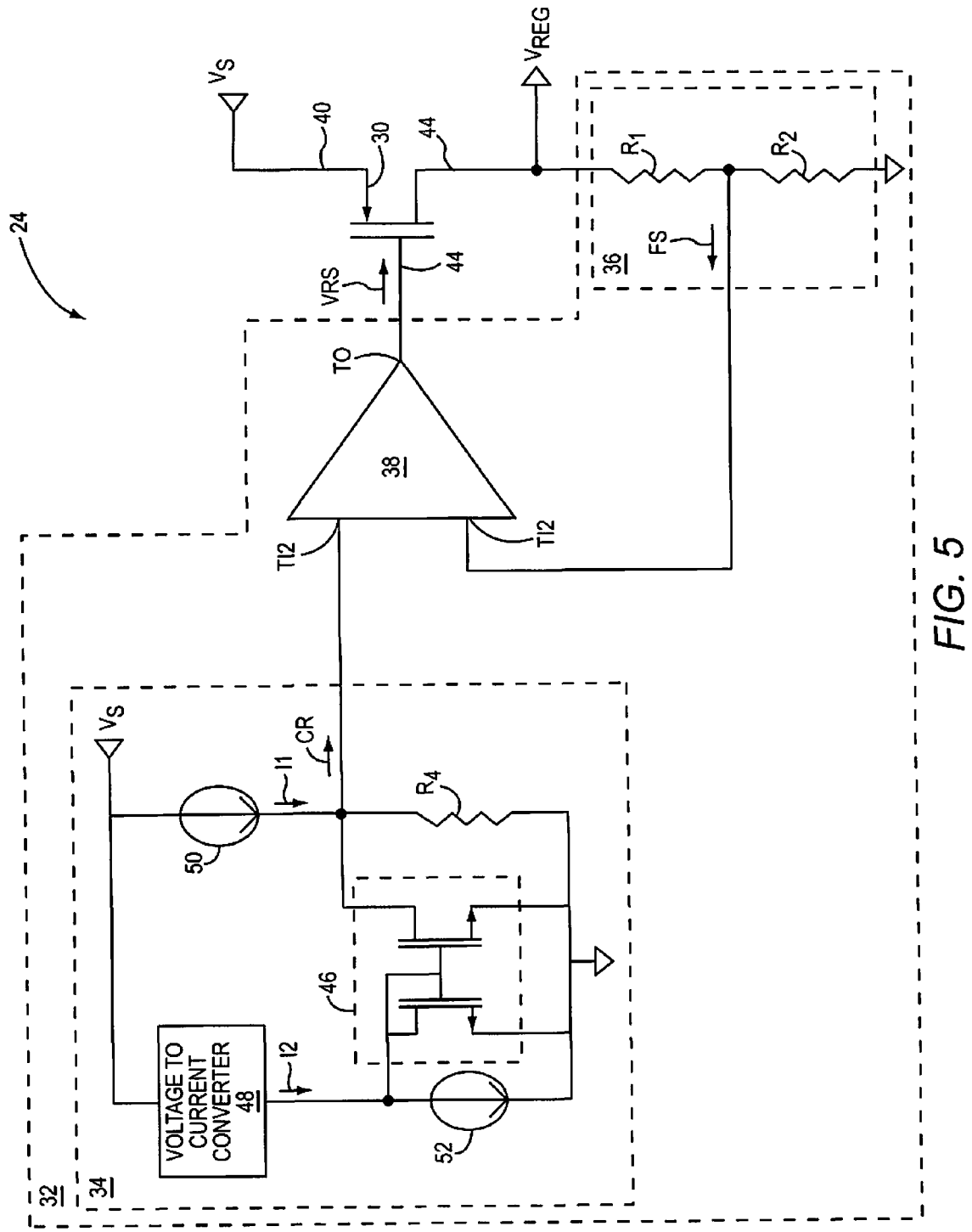
FIG. 5 illustrates one embodiment of the voltage regulation circuit shown in FIG. 1, wherein the voltage regulation circuit uses a voltage to current converter and a mirror circuit to generate a control reference used to provide the regulated voltage as shown in FIG. 1A.

Referring now to FIG. 5, FIG. 5 illustrates a circuit diagram of one implementation of the voltage regulation circuit 24 shown in FIG. 1, FIG. 2, FIG. 3, and FIG. 4. The voltage regulation circuit 24 is configured to receive the supply voltage $V_S$ and generate the regulated voltage $V_{REG}$ from the supply voltage $V_S$. More specifically, the voltage regulation circuit 24 includes a voltage regulator 30 configured to generate the regulated voltage $V_{REG}$ from the supply voltage $V_S$. As explained above, the regulated voltage $V_{REG}$ is provided to the RF amplification circuit 11, as described above with respect to FIG. 1, FIG. 2, FIG. 3, and FIG. 4.

The voltage regulation circuit 24 further includes an error detection circuit 32 configured to generate the control reference CR endogenously from the from the supply voltage $V_S$. As such, the error detection circuit 32 is configured to set the control reference CR such that the control reference CR indicates that the target regulated voltage is set approximately at the first voltage level in response to the supply voltage $V_S$ being below the threshold voltage level, and set the control reference CR such that the control reference CR indicates that the target regulated voltage is below the first voltage level and maintains the maximum output power of the RF amplification circuit 11 (shown in FIGS. 1-4) approximately at the first power level in response to the supply voltage being above the threshold voltage level, as explained above with respect to FIG. 1A. The error detection circuit 32 is also configured to operate the voltage regulator 30 such that a voltage regulator 30 drives the regulated voltage $V_{REG}$ to the target regulated voltage indicated by the control reference CR.

In this embodiment, the error detection circuit 32 includes a control reference circuit 34, a voltage divider 36, and an error amplifier 38. The voltage divider 36 is coupled so as to generate a feedback signal FS from the regulated voltage $V_{REG}$. In this manner, the feedback signal FS indicates the regulated voltage $V_{REG}$. The operation of the control reference circuit 34 is designed to endogenously generate the control reference CR and operate as described above with respect to FIG. 1A. The control reference circuit 34 is thus configured to generate the control reference CR endogenously from the supply voltage $V_S$. The control reference circuit 34 is also configured to set the control reference CR such that the control reference CR indicates that the target regulated voltage is set approximately at the first voltage level in response to the supply voltage $V_S$ being below the threshold voltage level. Finally, the control reference circuit 34 is configured to set the control reference CR such that the control reference CR indicates that the target regulated voltage is below the first voltage level and maintains the maximum output power of the RF amplification circuit 11 (shown in FIGS. 1-4) approximately at the first power level in response to the supply voltage $V_S$ being above the threshold voltage level.

The error amplifier 38 is configured to operate the voltage regulator 30 such that the voltage regulator 30 drives the regulated voltage $V_{REG}$ to the target regulated voltage indicated by the control reference CR. To do this, the error amplifier 38 is configured to receive the feedback signal FS that indicates the regulated voltage $V_{REG}$ at an error amplifier input terminus TI1. The error amplifier 38 is also configured to receive the control reference CR from the control reference circuit 34 at an error amplifier input terminus TI2. The error amplifier 38 compares the feedback signal FS and the control reference CR and is configured to generate a voltage regulation signal VRS at an error amplifier output terminus TO. The error amplifier output terminus TO is coupled to a control terminal of the voltage regulator 30. The error amplifier 38 may be configured to drive the voltage regulator 30 so that the feedback signal FS and the control reference CR are approximately equal. When the voltage difference between the control reference CR and the feedback signal FS is zero, the error amplifier maintains a voltage level of the voltage regulation signal VRS as substantially constant. However, when the voltage difference is not zero, the error amplifier 38 generates the voltage regulation signal VRS such that the regulated voltage $V_{REG}$ is adjusted, thereby adjusting the feedback signal FS. Adjustments continue until the feedback signal FS and the control reference CR are approximately equal. In this manner, the voltage regulation signal VRS operates the voltage regulator 30 so as to minimize a difference between the feedback signal FS and the control reference CR. Since the error amplifier output terminus TO is coupled to a control terminal of the voltage regulator 30, the voltage regulator 30 is configured to receive the voltage regulation signal VRS and generate the regulated voltage $V_{REG}$ in accordance with the voltage regulation signal VRS. As such, the regulated voltage $V_{REG}$ is driven to the target regulated voltage indicated by the control reference CR.

In this embodiment, the voltage regulation circuit 24 is configured as a low-drop-out (LDO) voltage regulation circuit. The voltage regulator 30 is a field effect transistor (FET) having a source terminal 40, a drain terminal 42, and a gate terminal 44 connected to the error amplifier output terminus TO. In this embodiment, the voltage regulator 30 is a P-type FET, and thus the source terminal 40 is coupled to receive the supply voltage $V_S$ and the drain terminal 42 is configured to output the regulated voltage $V_{REG}$. So long as the voltage regulator 30 is not saturated, the voltage regulator 30 regulates the regulated voltage $V_{REG}$ so that variations in the supply voltage $V_S$ do not significantly affect the regulated voltage $V_{REG}$. Since the voltage regulation circuit 24 is configured as a LDO voltage regulation circuit, the drop out voltage level is simply the saturation voltage level of the P-type FET. It should be noted that in alternative embodiments, the voltage regulation circuit 24 may be configured as a different type of regulation circuit, such as a standard voltage regulation circuit or a quasi LDO circuit. While not required, the LDO circuit configuration is generally preferable because the LDO circuit configuration tends to have the lowest drop out level and therefore can provide better power efficiency. The voltage divider 36 has a resistor R1 with a resistive value of r1 and a resistor R2 with a resistive value of r2.

With regard to the control reference circuit 34, the control reference circuit 34 includes a mirror circuit 46, a voltage to current converter 48, a current source 50, and a current source 52. The current source 50 is configured to generate a current I1, which has a substantially constant current level. The voltage to current converter 48 is configured to generate a control current I2 from the supply voltage $V_S$. The voltage to current converter 48 has an internal variable resistance r3. Thus, the control current I2 is approximately equal to Vs/r3. A resistor R4 has a resistance value of r3. The current source 52 is configured to generate a current I3, which has a substantially constant current level. The control reference CR in this case is a reference voltage $V_{REF}$. The equations below describe the operation of the control reference circuit 34.

$$V_{REG} = (1 + R1/R2) V_{REF} \quad (1)$$

$$I2 = V_S/r3 \quad (2)$$

$$V_{REF} = (I1 + I3 - V_S/r3)*r4 \text{ when } I2 > I3 \quad (3)$$

$$V_{REF} = I1*r4 \text{ when } I2 < I3 \quad (4)$$

Equations (1) and (4) combine to provide $$V_{REG} = (1 + r1/r2)*(I1 + I3 - V_S/r3)*r4 \quad (5)$$

Accordingly, the threshold voltage level is set by the current I3. Equation 5 shows how the regulated voltage $V_{REG}$ is inversely proportional to $V_S$ above the threshold voltage level. Furthermore, the mirror circuit 46 is configured to generate the control reference CR (e.g., in this case is a reference voltage $V_{REF}$) in accordance with the control current I2.

Figure 6:
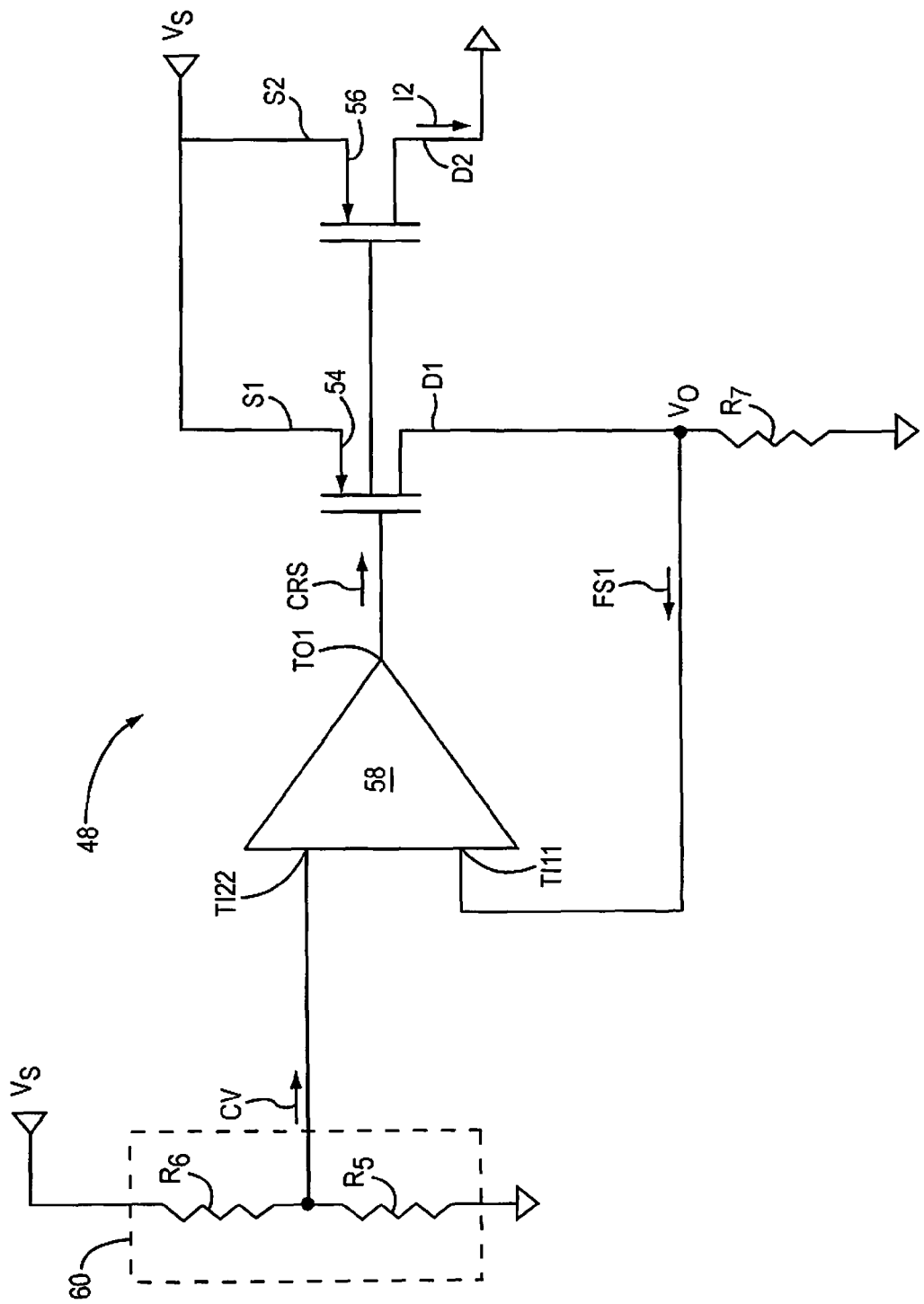
FIG. 6 illustrates an embodiment of the voltage to current converter shown in FIG. 5.

FIG. 6 illustrates one embodiment of the voltage to current converter 48 shown in FIG. 5. The voltage to current converter 48 includes a pair of control coupled transistors 54, 56 and an error amplifier 58. The error amplifier 58 is configured to drive the pair of control coupled transistors 54, 56 based on the supply voltage $V_S$ so as to generate the control current I2. In this embodiment, the error amplifier 58 is configured to operate the transistor 54 such that the transistor 54 drives the transistor 56 to generate the control current I2. To do this, the error amplifier 38 is configured to receive a feedback signal FS1 that indicates an output voltage $V_O$ at an error amplifier input terminus TI11. The error amplifier 58 is also configured to receive a control voltage CV from a voltage divider 60. The voltage divider 60 includes a resistor R5 having a resistive value of r5 and a resistor R6 having a resistive value r6. The feedback signal FS1 is provided using the resistor R7 coupled to ground. The voltage divider 60 is coupled between to receive the supply voltage $V_S$. The resistor R7 has a resistive value of r5.

The control voltage CV is received from the voltage divider 60 at the error amplifier input terminus TI22. The error amplifier 58 compares the feedback signal FS and the control reference CR, and is configured to generate a control signal CRS at an error amplifier output terminus TO1. The error amplifier output terminus TO1 is coupled to a control terminal of the transistor 54. In this embodiment, the transistors 54, 56 are both P-type FETs that are the same size. The error amplifier 58 may be configured to drive the transistor 54 so that the feedback signal FS1 and the control voltage CV are approximately equal. When the voltage difference between the control voltage CV and the feedback signal FS1 is zero, the error amplifier 58 maintains a voltage level of the control signal CRS as substantially constant. However, when the voltage difference is not zero, the error amplifier 58 generates the control signal CRS such that the output voltage $V_O$ is adjusted thereby adjusting the feedback signal FS1. Adjustments continue until the feedback signal FS1 and the control voltage CV are approximately equal. Since the error amplifier output terminus TO1 is coupled to the control terminal (i.e., the gate terminal) of the transistor 54, the transistor 54 is configured to receive the control signal CRS and generate the control current I2 in accordance with the control signal CRS. As shown, a source terminal S1, S2 of both of the transistors 54, 56 is coupled to receive the $V_S$. A drain terminal D1 of the transistor 54 generates the output voltage $V_O$ while the drain terminal D2 of the transistor 56 generates the control current I2.

Relevant equations for the voltage to current converter 48 are shown below.

$$CV = V_S*(R5/(R5+R6)) \quad (6)$$

Since transistors 54, 56 are the same size, the control current I2 through transistor 56 is given by:

$$I2 = V_S*r5/(r5*(r5+r6)) \quad (7)$$

$$I2 = V_S/(r5+r6) \quad (8)$$

If you equate r5+r6 as r3 then:

$$I2 = V_S/r3 \quad (9)$$

Figure 7:
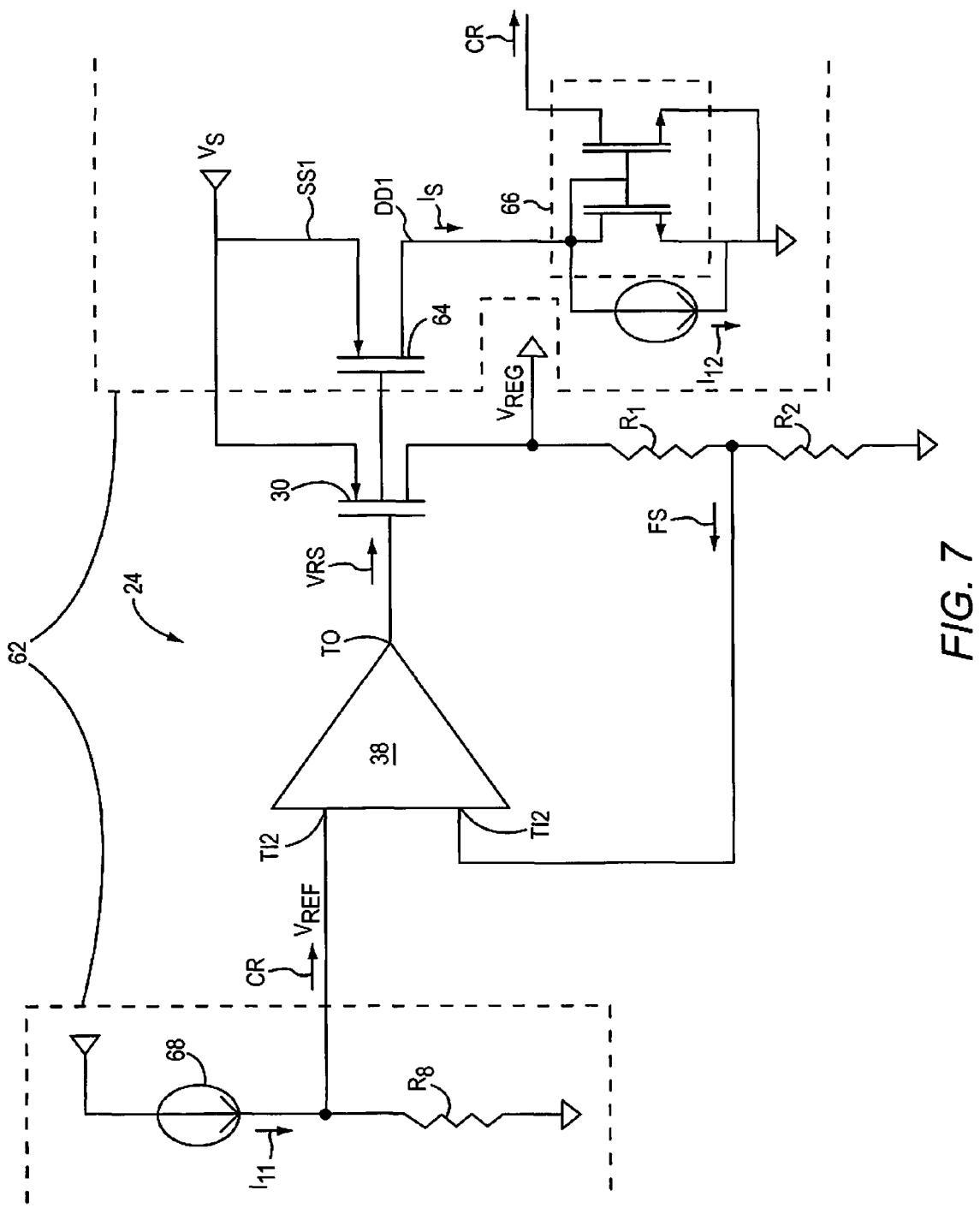
FIG. 7 illustrates another embodiment of the voltage regulation circuit shown in FIG. 1, wherein the voltage regulation circuit uses a sense transistor and a mirror circuit to generate the control reference used to provide the regulated voltage as shown in FIG. 1A.

FIG. 7 illustrates another embodiment of the voltage regulation circuit 24. The voltage regulation circuit 24 is the same as the voltage regulation circuit 24 shown in FIG. 5, except the voltage regulation circuit 24 shown in FIG. 7 includes another embodiment of a control reference circuit 62 configured to generate the control reference CR as described in FIG. 1A above. The control reference circuit 62 includes a sense transistor 64 configured to generate a control current $I_S$ from the supply voltage $V_S$. The sense transistor 64 is control coupled with the voltage regulator 30. A source SS1 of the sense transistor 64 is coupled to receive the supply voltage $V_S$ and a drain DD1 of the sense transistor 64 is coupled to transmit the control current $I_S$ to a mirror circuit 66. The control current $I_S$ is thus a mirror of the current flow through the voltage regulator 30.

The mirror circuit 66 is configured to generate the control reference CV (e.g., the control voltage $V_{REF}$) in accordance with the control current $I_S$. More specifically, a current source 68 is coupled to receive the supply voltage $V_S$ and to the error amplifier input terminus TI2. The current source 68 generates a current I11, which has a substantially constant current level. A resistor R8 is connected between the error amplifier input terminus TI2 and ground. The resistor R8 has a resistive value of r8. Additionally, the mirror circuit 66 is a current source 70 configured to generate a current I12 also having a substantially constant current level. Equations relevant to the operation of the control reference circuit 62 are shown below.

$$V_{REG}=(1+r1/r2)*V_{REF} \qquad (10)$$

$$V_{REF}=(I11+I12-I_S)*r8 \text{ when } I_S>I12 \qquad (11)$$

$$V_{REF}=I11*r8 \text{ when } I_S<I12 \qquad (12)$$

Combining (10) and (12) results in:

$$V_{REG}=(1+r1/r2)*(I11+I12+I_S)*r8 \qquad (13)$$

Equation (13) shows how $V_{REG}$ is inversely proportional to $I_S$ when the supply voltage $V_S$ is above the threshold voltage level as described above with respect to FIG. 1A.

Figure 8:
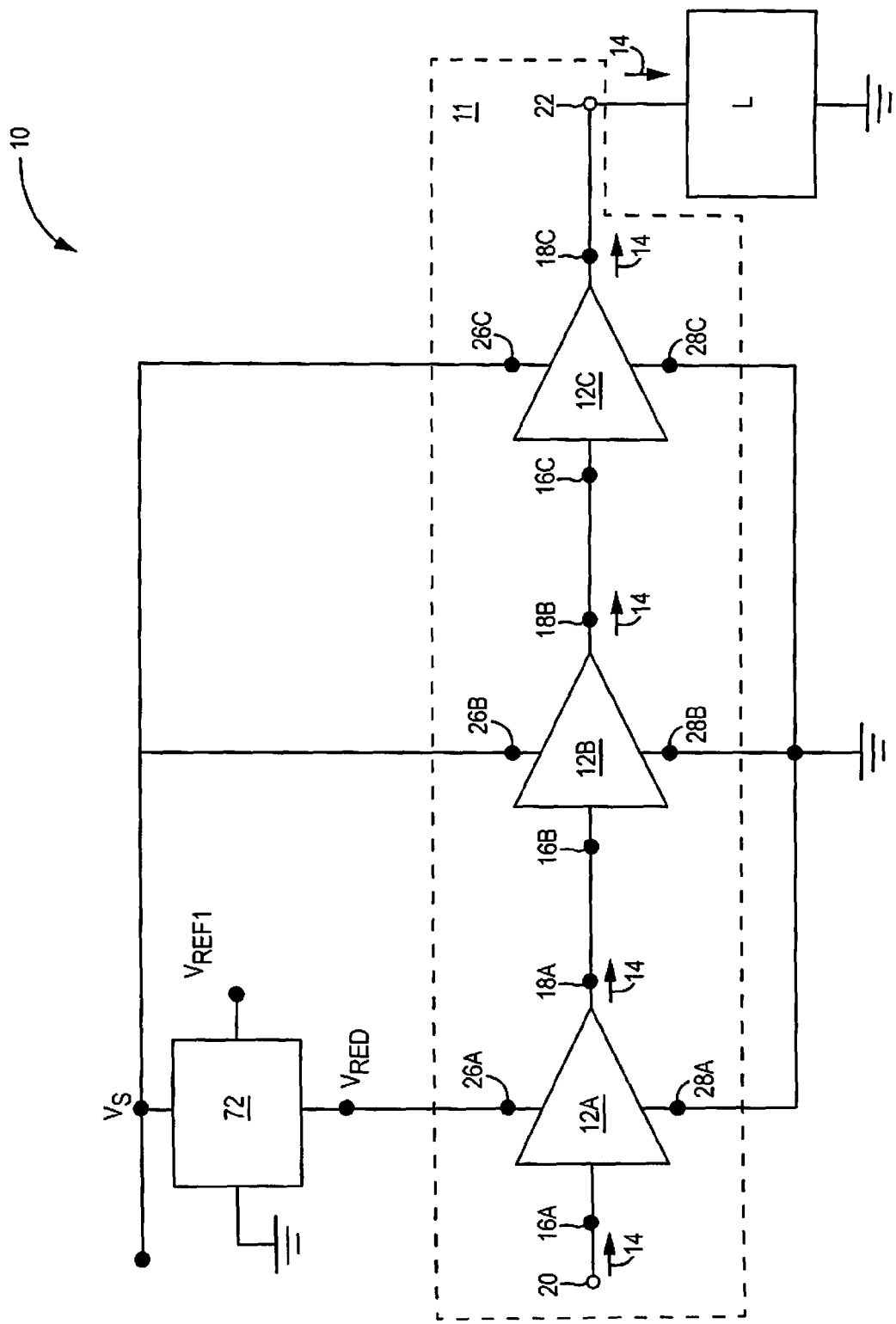
FIG. 8 illustrates still another embodiment of an RF amplification device that is the same as the RF amplification device shown in FIG. 1 except the voltage regulation circuit is replaced with a dynamic level shifter (DLS) circuit.

FIG. 8 illustrates another embodiment of the RF amplification device 10. The voltage regulation circuit 24 shown in FIG. 1 is replaced with a dynamic level shifter (DLS) circuit 72. The DLS circuit 72 is coupled between the supply voltage $V_S$ and the initial RF amplifier stage 12A. The DLS circuit 72 is also coupled to ground and coupled to a voltage reference $V_{REF1}$. The DLS circuit 72 is configured to provide a reduced voltage $V_{RED}$ to the initial RF amplifier stage 12A. In other embodiments, the voltage regulation circuit 24 shown in FIG. 2, 3, or 4 may be replaced with the DLS circuit 72.

When the supply voltage $V_S$ is above a first threshold voltage level $V_{TVL1}$, the DLS circuit 72 is configured in a first mode to provide the reduced voltage $V_{RED}$ as a first shifted voltage. The first shifted voltage is the supply voltage $V_S$ less a forward voltage drop of a first diode (not shown in FIG. 8) and a forward voltage drop of a second diode (not shown if FIG. 8). When the supply voltage $V_S$ is between the first threshold voltage level $V_{TVL1}$ and a second threshold voltage level $V_{TVL2}$, the DLS circuit 72 is configured in a second mode to provide the reduced voltage $V_{RED}$ as a second shifted voltage, wherein the second threshold voltage level $V_{TVL2}$ is less than the first threshold voltage level $V_{TVL1}$. The second shifted voltage is the supply voltage $V_S$ less the forward voltage drop of the second diode. When the supply voltage $V_S$ is below the second threshold voltage level $V_{TVL2}$, the DLS circuit 72 is configured in a third mode to provide the reduced voltage $V_{RED}$ as a third shifted voltage. The third shifted voltage may be approximately equal to the supply voltage.

Figure 9:
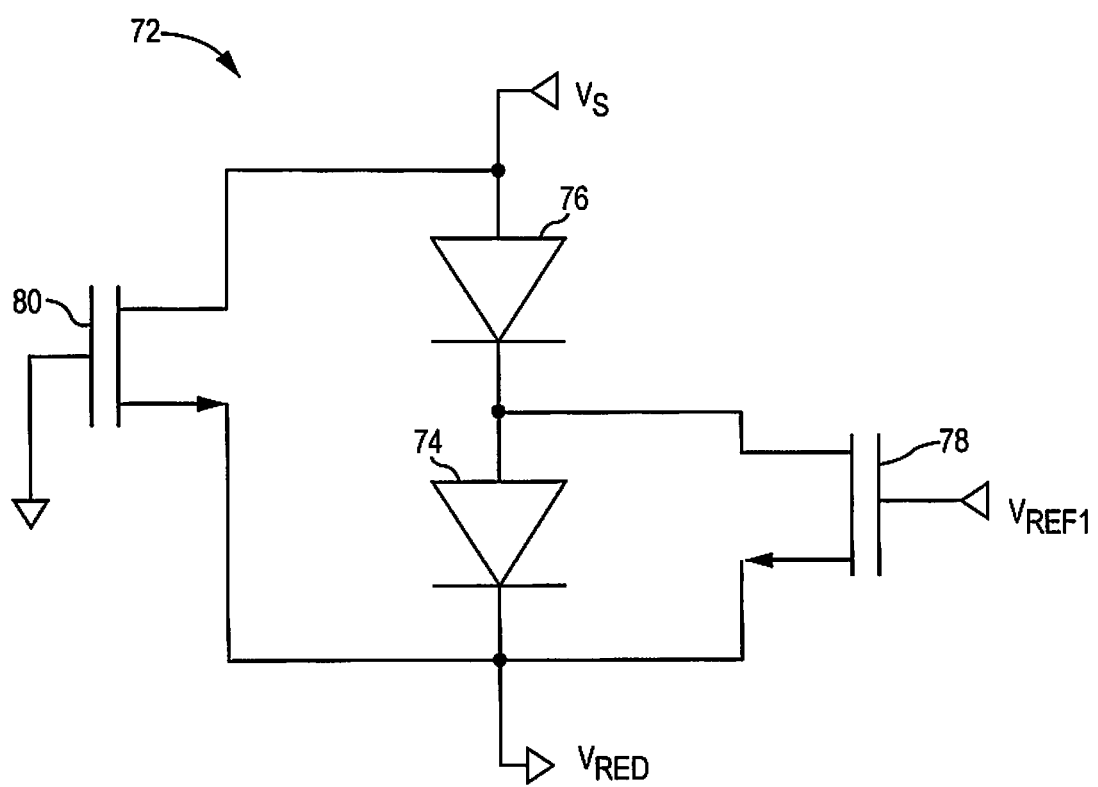
FIG. 9 illustrates one embodiment of the DLS circuit shown in FIG. 8, wherein the DLS circuit provides three modes of a reduced voltage from the supply voltage.

FIG. 9 illustrates a schematic of one embodiment of the DLS circuit 72 shown in FIG. 8. To provide the reduced voltage $V_{RED}$, a cathode of the first diode 74 is coupled to the initial RF amplifier stage 12A, to the source of the first shunt transistor 78, and to a source of the second shunt transistor 80. The anode of the first diode 74 is coupled to a cathode of the second diode 76 and to the drain of the first shunt transistor 78, while an anode of the second diode 76 is coupled to the supply voltage $V_S$ and to a drain of the second shunt transistor 80. The gate of the first shunt transistor 78 is coupled with a voltage reference $V_{REF1}$, while a gate of the second shunt transistor may be coupled with a ground.

The first shunt transistor 78 is configured to short-circuit the first diode 74 when the first shunt transistor 78 is turned on. The second shunt transistor 80 is configured to short-circuit the first diode 74 and the second diode 76 when the second shunt transistor 80 is turned on. The first shunt transistor 78 may be considered on when a first gate-to-source threshold voltage $V_{GS1on}$ is exceeded. Likewise, the second shunt transistor 80 may be considered on when a second gate-to-source threshold voltage $V_{GS2on}$ is exceeded.

The voltage reference $V_{REF1}$ is configured such that the first shunt transistor 78 turns on as the supply voltage $V_S$ is reduced, and the second shunt transistor 80 turns on as the supply voltage $V_S$ is further reduced.

In some embodiments, the first diode 74 may have a first diode forward voltage $V_{D1}$ between approximately 1.2 volts and approximately 1.3 volts; and the second diode 76 may have a second diode forward voltage $V_{D2}$ between approximately 0.75 volts and approximately 0.85 volts. In this embodiment, the first diode 74 may be a PIN diode and the second diode 76 may be a Schottky barrier diode. The PIN diode includes an undoped intrinsic semiconductor region between a p-type semiconductor region and an n-type semiconductor region.

In other embodiments, the first diode 74 may have a first diode forward voltage $V_{D1}$ between approximately 0.75 volts and approximately 0.85 volts; and the second diode 76 may have a second diode forward voltage $V_{D2}$ between approximately 1.2 volts and approximately 1.3 volts. In this embodiment, the first diode 74 may be a Schottky barrier diode and the second diode 76 may be a PIN diode.

In some embodiments, the first shunt transistor 78 may have a first transistor on-state resistance $R_{S1}$ between approximately 0.5 ohms and approximately 1.5 ohms; and the second shunt transistor 80 may have a second transistor on-state resistance $R_{S2}$ between approximately 0.8 ohms and approximately 2 ohms. The first shunt transistor 78 may have the first gate-to-source threshold voltage $V_{GS1on}$ between approximately −1.5 volts and approximately −1.6 volts; and the second shunt transistor 80 may have the second gate-to-source threshold voltage $V_{GS2on}$ between approximately −1.5 volts and approximately −1.6 volts. The shunt transistors 78 and 80 may each be a depletion mode n-type FET.

In other embodiments, the first shunt transistor 78 may have the first transistor on-state resistance $R_{S1}$ between approximately 0.5 ohms and approximately 1.5 ohms; and the second shunt transistor 80 may have the second transistor on-state resistance $R_{S2}$ between approximately 0.8 ohms and approximately 2 ohms. The first shunt transistor 78 may have the first gate-to-source threshold voltage $V_{GS1on}$ between approximately 0 volts and approximately −0.1 volts; and the second shunt transistor 80 may have the second gate-to-source threshold voltage $V_{GS2on}$ between approximately 0 volts and approximately −0.1 volts. The shunt transistors 78 and 80 may each be a depletion mode n-type pseudomorphic high electron mobility transistor (pHEMT).

When calculating a short-circuit voltage of either the first or second shunt transistors 78 and 80, a DLS current $I_{DLS}$ may be used. The DLS current $I_{DLS}$ may be defined as the current that flows through the DLS circuit 72 from the supply voltage $V_S$ to the RF amplification device 10, and may correspond with the drain-to-source current through each one of the transistors 78 and 80. Gate currents of the first and second shunt transistors 78 and 80 may be negligible in this calculation. In some embodiments, the short-circuit voltage of the first and second shunt transistors 78 and 80 may be negligible when compared to the first and second diode forward voltages $V_{D1}$ and $V_{D2}$.

As described in FIG. 8, the supply voltage $V_S$, as compared with the first and second threshold voltage levels $V_{TVL1}$ and $V_{TVL1}$ define the first, second, and third modes of the DLS circuit 72. For FIG. 9, equation (14) defines the first threshold voltage level $V_{TVL1}$ and equation (15) defines the second threshold voltage level $V_{TVL1}$.

$$V_{TVL1} = V_{GS1} + V_{REF1} \quad (14)$$

$$V_{TVL2} = V_{GS2} \quad (15)$$

In other embodiments, the gate of the second shunt transistor 80 may be coupled to a second voltage reference $V_{REF2}$ (not shown) having a voltage level between the first voltage reference $V_{REF1}$ and ground. In this embodiment, equation (16) defines the second threshold voltage level $V_{TVL2}$.

$$V_{TVL2} = V_{GS2} + V_{REF2} \quad (16)$$

When in the first mode, the DLS circuit 72 provides the reduced voltage $V_{RED}$ via the first diode 74 and the second diode 76. The reduced voltage $V_{RED}$ at the first shifted voltage level may be approximated as in equation (17).

$$V_{RED} = V_S - V_{D1} - V_{D2} \text{ when } V_S > V_{TVL1} \quad (17)$$

In the first mode, the supply voltage $V_S$ is greater than the first threshold voltage level $V_{TVL1}$. As such, the first gate-to-source threshold voltage $V_{GS1on}$ is not exceeded and the first shunt transistor 78 is off. Likewise, the second gate-to-source threshold voltage $V_{GS2on}$ is not exceeded and the second shunt transistor 78 is also off.

When in the second mode, the DLS circuit 72 provides the reduced voltage $V_{RED}$ via the first shunt transistor 78 and the second diode 76. The reduced voltage $V_{RED}$ at the second shifted voltage level may be approximated as in equation (18).

$$V_{RED} = V_S - (I_{DLS} \times R_{S1}) - V_{D2} \text{ when } V_{TVL1} > V_S > V_{TVL2} \quad (18)$$

In the second mode, the supply voltage $V_S$ is less than the first threshold voltage level $V_{TVL1}$ and greater than the second threshold voltage level $V_{TVL2}$. As such, the first gate-to-source threshold voltage $V_{GS1on}$ is exceeded and the first shunt transistor 78 is on, while the second gate-to-source threshold voltage $V_{GS2on}$ is not exceeded and the second shunt transistor 80 remains off.

When in the third mode, the DLS circuit 72 provides the reduced voltage $V_{RED}$ via the second shunt transistor 80. The reduced voltage $V_{RED}$ at the third shifted voltage level may be approximated as in equation (19).

$$V_{RED} = V_S - (I_{DLS} \times R_{S2}) \text{ when } V_S < V_{TVL2} \quad (19)$$

In the third mode, the supply voltage $V_S$ is less than the second threshold voltage level $V_{TVL2}$. As such, the first gate-to-source threshold voltage $V_{GS1on}$ is exceeded and the first shunt transistor 78 is on. Likewise, the second gate-to-source threshold voltage $V_{GS2on}$ is exceed and the second shunt transistor 80 is also on.

As compared with voltage regulation circuit 24 of FIGS. 1 and 7, the DLS circuit 72 operates at a lower power efficiency. However, the DLS circuit operates in a feed forward manner without transient spikes as the supply voltage $V_S$ transitions from higher to lower voltages. The DLS circuit 72 can also operate at much lower values of $V_S$ than the voltage regulation circuit 24. The DLS circuit 72 may be implemented in any bipolar FET (BiFET) process or any other suitable semiconductor process.

Figure 10:
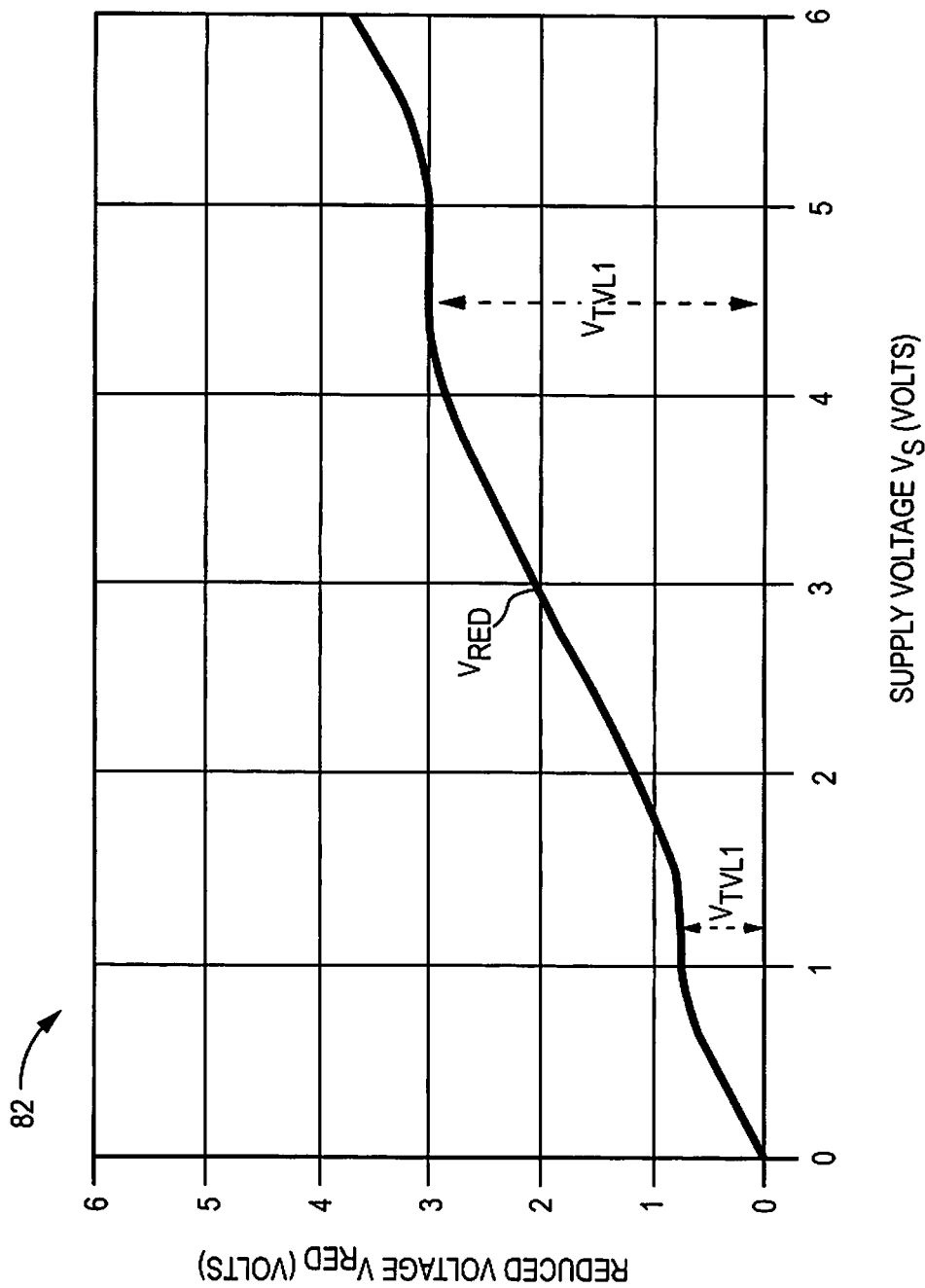
FIG. 10 illustrates one embodiment of a relationship between the supply voltage and the reduced voltage generated by the DLS circuit shown in FIG. 9.

FIG. 10 illustrates one embodiment of a voltage response graph of the DLS circuit 72 of FIG. 9. The voltage response graph depicts the reduced voltage $V_{RED}$ as a function of the supply voltage $V_S$.

Figure 11:
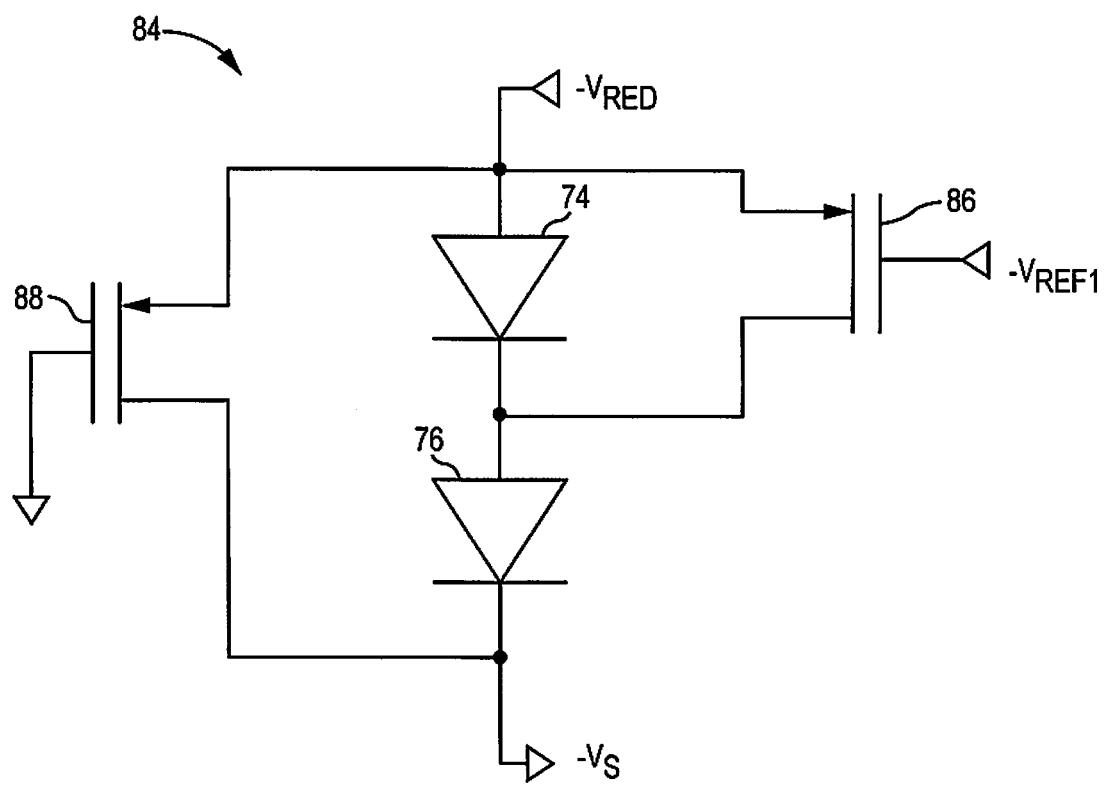
FIG. 11 illustrates an alternate embodiment wherein a reverse polarity DLS circuit is configured to provide a negative reduced voltage from a negative supply voltage.

FIG. 11 illustrates a reverse polarity DLS (RPDLS) circuit 84 as an alternate embodiment of the DLS circuit 72. The RPDLS circuit 84 may be coupled to a negative supply voltage $-V_S$ to provide a negative reduced voltage $-V_{REG}$. The first and second diodes 74 and 76 of the DLS circuit 72 are used for the RPDLS circuit 84. However, the first and second shunt transistors 78 and 80 are replaced with first and second p-type shunt transistors 86 and 88.

To provide the negative reduced voltage $-V_{RED}$, the anode of the first diode 74 is coupled to the source of the first p-type shunt transistor 86, and to a source of the second p-type shunt transistor 88. The cathode of the first diode 74 is coupled to the anode of the second diode 76 and to the drain of the first p-type shunt transistor 86, while the cathode of the second diode 76 is coupled to the negative supply voltage $-V_S$ and to a drain of the second p-type shunt transistor 88. The gate of the first shunt transistor 86 is coupled with a negative voltage reference $-V_{REF1}$, while a gate of the second shunt transistor 88 is coupled with ground. The RPDLS circuit 84 is configured to operate in a similar manner as the DLS circuit 72 of FIG. 9.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) amplification device comprising:
    an RF amplification circuit; and
    a dynamic level shifter (DLS) circuit coupled between a supply voltage and the RF amplification circuit, the DLS circuit configured to:
        provide a first shifted voltage to the RF amplification circuit via a first diode when the supply voltage is above a first threshold voltage level;
        provide a second shifted voltage to the RF amplification circuit via a first shunt transistor when the supply voltage is below the first threshold voltage level, wherein the supply voltage less the second shifted voltage is less than the supply voltage less the first shifted voltage;
        provide the first shifted voltage via the first diode and a second diode that is coupled in series with the first diode;
        provide the second shifted voltage via the first shunt transistor and the second diode when the supply voltage is between the first threshold voltage level and a second threshold voltage level; and
        provide a third shifted voltage to the RF amplification circuit via a second shunt transistor when the supply voltage is below the second threshold voltage level, wherein the supply voltage less the third shifted voltage is less than the supply voltage less the second shifted voltage.

2. The RF amplification device of claim 1 wherein the first shunt transistor is configured to short-circuit the first diode when the supply voltage is below the first threshold voltage level.

3. The RF amplification device of claim 2 wherein:
    a cathode of the first diode is coupled to the RF amplification circuit and a source of the first shunt transistor;
    an anode of the first diode is coupled to a drain of the first shunt transistor; and
    a gate of the first shunt transistor is coupled to a voltage reference.

4. The RF amplification device of claim 3 wherein:
    the first diode is a PIN diode; and
        the first shunt transistor is one of a depletion mode n-type field effect transistor (FET) and a depletion mode n-type pseudomorphic high electron mobility transistor (pHEMT).

5. The RF amplification device of claim 1 wherein the first shunt transistor is configured to short-circuit the first diode when the supply voltage is below the first threshold voltage level and the second shunt transistor is configured to short-circuit the first diode and the second diode when the supply voltage is below the second threshold voltage level.

6. The RF amplification device of claim 5 wherein:
the first shifted voltage is the supply voltage less a forward voltage drop of the first diode and a forward voltage drop of the second diode;
the second shifted voltage is the supply voltage less the forward voltage drop of the second diode; and
the third shifted voltage is approximately equal to the supply voltage.

7. The RF amplification device of claim 6 wherein:
a cathode of the first diode is coupled to the RF amplification circuit, a source of the first shunt transistor, and a source of the second shunt transistor;
an anode of the first diode is coupled to a cathode of the second diode and to a drain of the first shunt transistor;
an anode of the second diode is coupled to the supply voltage and a drain of the second shunt transistor;
a gate of the first shunt transistor is coupled with a voltage reference; and
a gate of the second shunt transistor is coupled with a ground.

8. The RF amplification device of claim 7 wherein:
the first diode is a PIN diode; and
the second diode is a Schottky barrier diode.

9. The RF amplification device of claim 8 wherein:
the first shunt transistor is one of a depletion mode n-type field effect transistor (FET) and a depletion mode n-type pseudomorphic high electron mobility transistor (pHEMT); and
the second shunt transistor is one of a depletion mode n-type FET and a depletion mode n-type pHEMT.

10. A dynamic level shifter (DLS) circuit configured to receive a supply voltage and provide power to a radio frequency (RF) amplification device, the DLS circuit comprising:
a first diode; and
a first shunt transistor, wherein the DLS circuit is configured to:
provide a first shifted voltage via the first diode when the supply voltage is above a first threshold voltage level;
provide a second shifted voltage via the first shunt transistor when the supply voltage is below the first threshold voltage level;
provide the first shifted voltage via the first diode and a second diode that is coupled in series with the first diode;
provide the second shifted voltage via the first shunt transistor and the second diode when the supply voltage is between the first threshold voltage level and a second threshold voltage level; and
provide a third shifted voltage to the RF amplification device via a second shunt transistor when the supply voltage is below the second threshold voltage level, wherein the supply voltage less the third shifted voltage is less than the supply voltage less the second shifted voltage.

11. The DLS circuit of claim 10 wherein the first shunt transistor is configured to short-circuit the first diode when the supply voltage is below the first threshold voltage level.

12. The DLS circuit of claim 11 wherein:
a cathode of the first diode is coupled to the RF amplification circuit and a source of the first shunt transistor;
an anode of the first diode is coupled to a drain of the first shunt transistor; and
a gate of the first shunt transistor is coupled to a voltage reference.

13. The DLS circuit of claim 12 wherein:
the first diode is a PIN diode; and
the first shunt transistor is one of a depletion mode n-type field effect transistor (FET) and a depletion mode n-type pseudomorphic high electron mobility transistor (pHEMT).

14. The DLS circuit of claim 10 wherein the first shunt transistor is configured to short-circuit the first diode when the supply voltage is below the first threshold voltage level and the second shunt transistor is configured to short-circuit the first diode and the second diode when the supply voltage is below the second threshold voltage level.

15. The DLS circuit of claim 14 wherein:
the first shifted voltage is the supply voltage less a forward voltage drop of the first diode and a forward voltage drop of the second diode;
the second shifted voltage is the supply voltage less the forward voltage drop of the second diode; and
the third shifted voltage is approximately equal to the supply voltage.

16. The DLS circuit of claim 15 wherein:
a cathode of the first diode is coupled to the RF amplification circuit, a source of the first shunt transistor, and a source of the second shunt transistor;
an anode of the first diode is coupled to a cathode of the second diode and to a drain of the first shunt transistor;
an anode of the second diode is coupled to the supply voltage and a drain of the second shunt transistor;
a gate of the first shunt transistor is coupled with a voltage reference; and
a gate of the second shunt transistor is coupled with a ground.

17. The DLS circuit of claim 16 wherein:
the first diode is a PIN diode; and
the second diode is a Schottky barrier diode.

18. The DLS circuit of claim 16 wherein:
the first shunt transistor is one of a depletion mode n-type field effect transistor (FET) and a depletion mode n-type pseudomorphic high electron mobility transistor (pHEMT); and
the second shunt transistor is one of a depletion mode n-type FET and a depletion mode n-type pHEMT.

* * * * *

UNITED STATES PATENT AND TRADEMARK OFFICE
CERTIFICATE OF CORRECTION

PATENT NO. : 9,647,610 B2
APPLICATION NO. : 15/140605
DATED : May 9, 2017
INVENTOR(S) : Praveen V. Nadimpalli et al.

It is certified that error appears in the above-identified patent and that said Letters Patent is hereby corrected as shown below:

In the Specification

In Column 6, Line 37, replace "supply voltage Vs" with --supply voltage $V_S$--.

In Column 8, Line 19, replace "supply voltage Vs" with --supply voltage $V_S$--.

In Column 11, Line 24, replace "equal to Vs/r3" with --equal to $V_S/r3$--.

In Column 13, Line 12, equation (13), replace "$V_{REG}=(1+r1/r2)*(I11+I12+I_S)*r8$" with --$V_{REG}=(1+r1/r2)*(I11+I12-I_S)*r8$--.

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*